(12) United States Patent
Hwang et al.

(10) Patent No.: US 12,371,783 B2
(45) Date of Patent: Jul. 29, 2025

(54) INTERNAL CHAMBER PROCESSING METHOD AND SUBSTRATE PROCESSING METHOD

(71) Applicant: WONIK IPS CO., LTD., Pyeongtaek-si (KR)

(72) Inventors: Ah Young Hwang, Pyeongtaek-si (KR); Won Jun Jang, Seoul (KR); Joo Suop Kim, Hwaseong-si (KR); Kyung Park, Seoul (KR); Jin Seo Kim, Seoul (KR); Won Sik Ahn, Osan-si (KR); Dae Seong Lee, Dongducheon-si (KR); Chang Hun Kim, Osan-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 543 days.

(21) Appl. No.: 17/550,399

(22) Filed: Dec. 14, 2021

(65) Prior Publication Data

US 2022/0411923 A1 Dec. 29, 2022

(30) Foreign Application Priority Data

Jun. 28, 2021 (KR) .................. 10-2021-0083995

(51) Int. Cl.
*C23C 16/44* (2006.01)
*C23C 14/56* (2006.01)
(Continued)

(52) U.S. Cl.
CPC ........ *C23C 16/4408* (2013.01); *C23C 14/564* (2013.01); *C23C 16/4405* (2013.01);
(Continued)

(58) Field of Classification Search
None
See application file for complete search history.

(56) References Cited

U.S. PATENT DOCUMENTS

2009/0302024 A1* 12/2009 Aiba .................. H01L 21/324
700/282
2014/0087568 A1 3/2014 Noda et al.
(Continued)

FOREIGN PATENT DOCUMENTS

CN 101457338 A 6/2009
CN 112185790 A 1/2021
(Continued)

OTHER PUBLICATIONS

JP2014120680 English translation, accessed on Apr. 2024. (Year: 2014).*

*Primary Examiner* — Kaj K Olsen
*Assistant Examiner* — Arlyn I Rivera-Cordero
(74) *Attorney, Agent, or Firm* — WILLIAM PARK & ASSOCIATES LTD.

(57) ABSTRACT

The present invention relates to an internal chamber processing method, and more particularly, to an internal chamber processing method for performing processing on a chamber and a component inside the chamber. Disclosed is an internal chamber processing method for processing the inside of a chamber in which substrate processing is performed, the method including a pressurizing operation (S100) of raising a pressure inside a chamber to a first pressure ($P_1$) higher than the atmospheric pressure by using a pressurized gas and a depressurizing operation of lowering the pressure inside the chamber from the first pressure ($P_1$) to a second pressure ($P_2$) after the pressurizing operation (S100). The pressurizing operation (S100) and the depressurizing operation (S200) are performed in a state in which a substrate to be processed is removed from the inside of the chamber.

19 Claims, 4 Drawing Sheets

(51) Int. Cl.
*H01L 21/02* (2006.01)
*H01L 21/67* (2006.01)

(52) U.S. Cl.
CPC ...... *H01L 21/0228* (2013.01); *H01L 21/0262* (2013.01); *H01L 21/67248* (2013.01)

(56) References Cited

U.S. PATENT DOCUMENTS

2019/0186014 A1* 6/2019 Kikama ............ H01L 21/67109
2021/0118682 A1* 4/2021 Jang ................. H01L 21/28088

FOREIGN PATENT DOCUMENTS

| | | |
|---|---|---|
| JP | 2003277935 A | 10/2003 |
| JP | 2007146252 A | 6/2007 |
| JP | 2008218984 A | 9/2008 |
| JP | 2014120680 A | 6/2014 |
| JP | 2021052092 A | 4/2021 |
| KR | 1020200006422 A | 1/2020 |
| KR | 1020200029895 A | 3/2020 |
| KR | 1020200031798 A | 3/2020 |
| WO | 2019058553 A1 | 3/2019 |

\* cited by examiner

INTERNAL CHAMBER PROCESSING METHOD AND SUBSTRATE PROCESSING METHOD

CROSS-REFERENCE TO RELATED APPLICATIONS

This U.S. non-provisional patent application claims priority under 35 U.S.C. § 119 of Korean Patent Application No. 10-2021-0083995, filed on Jun. 28, 2021, the entire contents of which are hereby incorporated by reference.

FIELD OF THE INVENTION

The present invention disclosed herein relates to an internal chamber processing method and a substrate processing method, and more particularly, to an internal chamber processing method for performing processing on a chamber and a component inside the chamber, and a substrate processing method.

BACKGROUND ART

Elements such as semiconductors, LCD substrates, and OLED substrates are manufactured through semiconductor processes including one or more deposition processes and etching processes.

In particular, the semiconductor element has a thin film which is formed, by a deposition process, on the substrate surface so as to form circuit patterns and the like, and this formation may be performed by various semiconductor processes such as CVD, PVD, and ALD.

Meanwhile, depending on the deposition processes, materials used for deposition may be deposited on a chamber and internal members of the chamber, that is, the inner wall of the chamber and components installed therein. As substrate processing progresses, these materials become thicker and are separated to act as particles.

Accordingly, impurities are attached to the substrate being processed, and the level of completion of the substrate processing deteriorates.

Also, sustained maintenance has to be performed to persistently remove these materials, and thus, a processing time for the substrate processing increases, and efficiency deteriorates.

(Paten Document 1) KR 10-2020-0006422 A1
(Paten Document 2) KR 10-2020-0029895 A1
(Paten Document 3) KR 10-2020-0031798 A1

SUMMARY OF THE INVENTION

To solve the above mentioned limitations, the purpose of the present invention is to provide an internal chamber processing method and a substrate processing method, capable of removing pollutants on a chamber and internal members of the chamber and preventing the pollutants from being deposited thereon.

In accordance with an embodiment of the present invention, an internal chamber processing method for processing the inside of a chamber in which substrate processing is performed includes: a pressurizing operation (S100) of raising a pressure inside a chamber to a first pressure ($P_1$) higher than the atmospheric pressure by using a pressurized gas; and a depressurizing operation (S200) of lowering the pressure inside the chamber from the first pressure ($P_1$) to a second pressure ($P_2$) after the pressurizing operation (S100), wherein the pressurizing operation (S100) and the depressurizing operation (S200) are performed in a state in which a substrate to be processed is removed from the inside of the chamber.

The second pressure ($P_2$) may be lower than the atmospheric pressure.

When the pressurizing operation (S100) and the depressurizing operation (S200) are referred to as one unit cycle, unit cycles may be performed n times (n≥1).

The pressurized gas may be a hydrogen gas ($H_2$).

In the pressurizing operation (S100), surfaces of an inner wall of the chamber and an internal member installed inside the chamber may be coated by coupling some or all of components of the pressurized gas to the surfaces of the inner wall of the chamber and the internal member installed inside the chamber.

At least one of the chamber and the internal member installed inside the chamber may include a quartz material.

The internal member installed inside the chamber may be installed to move to the inside and outside of the chamber and include a substrate support part for supporting at least one dummy substrate.

In the pressurizing operation (S100), the pressurized gas may produce a by-product by reacting with impurities on the surface or the inside of at least one of the inner wall of the chamber and the internal member installed inside the chamber, wherein in the depressurizing operation (S200), the by-product is discharged to the outside of the chamber.

The internal chamber processing method may further include, prior to the pressurizing operation (S100), a processing determination operation (S500) of determining whether or not processing on the inside of the chamber is necessary.

In the processing determination operation (S500), sheet resistance on the substrate processed inside the chamber may be measured, and it may be determined that the pressurizing operation (S100) is performed when the measurement value is greater than or equal to a preset value.

The pressurizing operation (S100) may include a pressure raising operation of raising the pressure inside the chamber to the first pressure ($P_1$) and a high-pressure maintaining operation of maintaining the pressure inside the chamber at the first pressure ($P_1$) for a certain period of time after the pressure raising operation.

The internal chamber processing method may further include a temperature raising operation of raising a temperature inside the chamber from a first temperature ($T_1$) to a processing temperature ($T_2$) higher than the room temperature, a high-temperature maintaining operation of maintaining the processing temperature ($T_2$), and a temperature lowering operation of lowering the temperature inside the chamber from the processing temperature ($T_2$) to a second temperature ($T_3$), wherein the pressurizing operation (S100) and the depressurizing operation (S200) are referred to as one unit cycle, unit cycles are performed n times (n≥1), and at least one of the unit cycles is performed during the high-temperature maintaining operation.

The internal chamber processing method may include a temperature raising operation of raising a temperature inside the chamber from a first temperature ($T_1$) to a processing temperature ($T_2$) higher than the room temperature and a temperature lowering operation of lowering the temperature inside the chamber from the processing temperature ($T_2$) to a second temperature ($T_3$), wherein the temperature raising operation or the temperature lowering operation is performed during the high-pressure maintaining operation.

When the pressurizing operation (S100) and the depressurizing operation (S200) are referred to as one unit cycle, unit cycles may be repeatedly performed n times (n≥2), and the temperature lowering operation may be performed during the high-pressure maintaining operation of the n-th pressurizing operation.

In accordance with an embodiment of the present invention, a substrate processing method includes: an internal chamber processing operation (S10) for processing the inside of the chamber in which substrate processing is performed; a substrate inputting operation (S300) of inputting a substrate to be processed to the chamber after the internal chamber processing operation (S10); a substrate processing operation (S20) of performing substrate processing on the substrate input into the chamber; and a substrate ejecting operation (S400) of ejecting the substrate processed through the substrate processing operation (S20), wherein the substrate inputting operation (S300), the substrate processing operation (S20), and the substrate ejecting operation (S400) are referred to as one unit process (S30), and unit processes (S30) are repeatedly performed n times (n≥2).

The internal chamber processing operation (S10) may be performed between the unit process (S30) and the unit process (S30) or prior to the first unit process (S30).

The internal chamber processing operation (S10) may be performed between the unit process (S30) and the unit process (S30), and the substrate processing method may further include a processing determination operation (S500) of determining whether or not processing on the inside of the chamber is necessary after the unit process (S30) is performed.

Sheet resistance on the processed substrate may be measured in the processing determination operation (S500), and the internal chamber processing operation (S10) may be performed when the measurement value is greater than or equal to a preset value, or the unit process (S30) may be performed when the measurement value is less than the preset value.

The substrate processing operation (S20) may include a substrate processing-pressurizing operation of raising a pressure inside the chamber to a pressure higher than the atmospheric pressure and a substrate processing-depressurizing operation of lowering the pressure inside the chamber after the substrate processing-pressurizing operation.

The substrate processing-depressurizing operation may lower the pressure inside the chamber to a pressure lower than the atmospheric pressure, and the substrate processing-pressurizing operation and the substrate processing-depressurizing operation may be repeatedly performed several times.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Hereinafter, an internal chamber processing method and a substrate processing method according to the present invention according to the present invention will be described with reference to the accompanying drawings.

Figure 4:
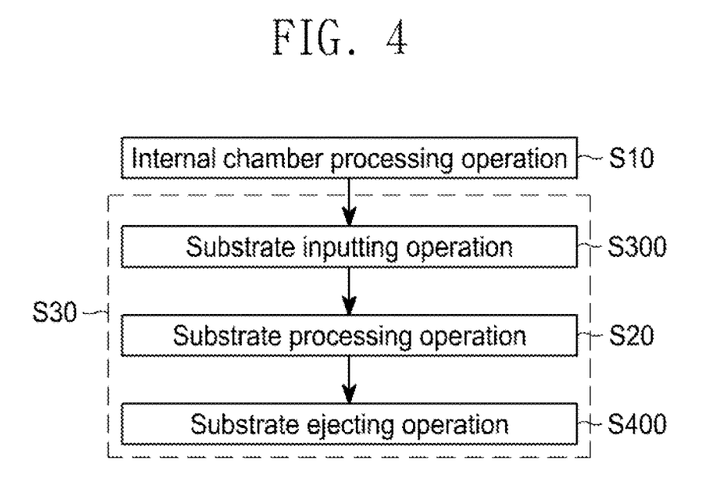
FIG. 4 is a flowchart showing an embodiment of s substrate processing method according to the present invention.
Figure 5:
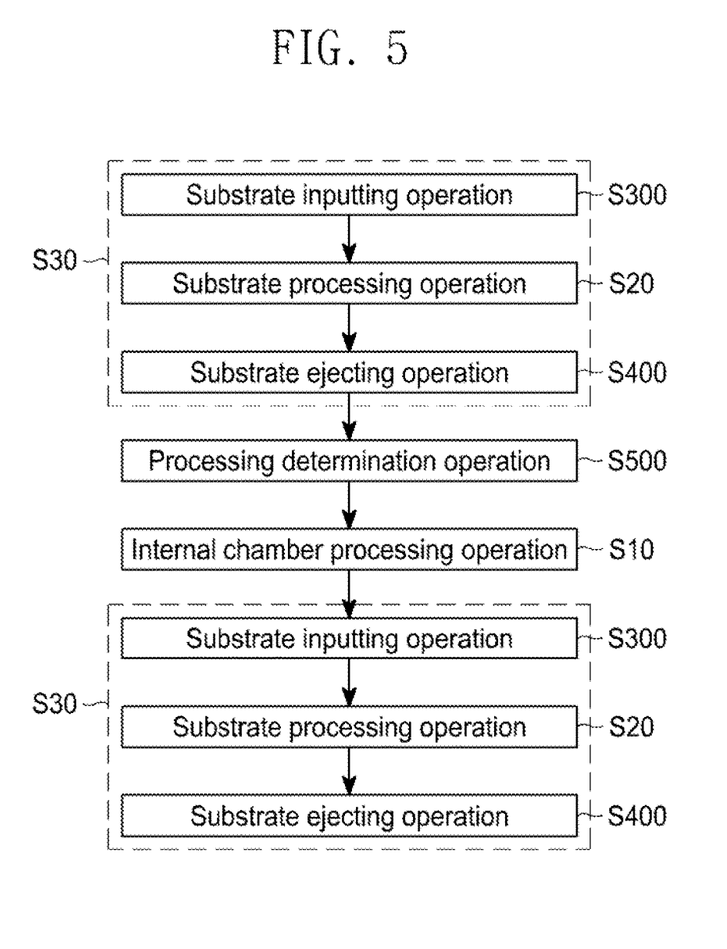
FIG. 5 is a flowchart showing another embodiment of the substrate processing method of FIG. 4.

As illustrated in FIGS. 4 and 5, a substrate processing method according to the present invention includes: an internal chamber processing operation (S10) for processing the inside of the chamber in which substrate processing is performed; a substrate inputting operation (S300) of inputting a substrate to be processed to the chamber after the internal chamber processing operation; a substrate processing operation (S20) of performing substrate processing on the substrate input into the chamber; and a substrate ejecting operation (S400) of ejecting the substrate processed through the substrate processing operation (S20). The substrate inputting operation (S300), the substrate processing operation (S20), and the substrate ejecting operation (S400) are referred to as one unit process (S30), and unit processes are repeatedly performed n times.

Here, the substrate to be processed may be understood as having a meaning that includes all substrates encompassing substrates used in display devices such as an LED, and LCD, and an OLED, semiconductor substrates, solar cell substrates, and glass substrates.

The chamber is configured to have a processing space to process the substrate, and may have various configurations.

Here, the chamber may be configured to perform substrate processing on a single substrate, and in another example, may be configured to perform substrate processing on a plurality of substrates vertically stacked in a batch type.

Hereinafter, an embodiment in a batch type capable of simultaneously performing the plurality of substrates will be described, but it is apparent that a single wafer-type structure performing substrate processing on a single substrate may also be applied.

The chamber may have a single pipe structure or a dual pipe structure and has a processing space formed therein, and may be configured such that a gas is supplied or exhausted through a lower manifold.

Here, the chamber has a structure in which the lower portion thereof is open, and the lower portion may be opened and closed by a cap flange or the like. Accordingly, the closed processing space is formed, and the substrate may be input or ejected.

Meanwhile, here, the chamber may be made of a metal material including aluminum, and may be made of a quartz material in another example.

Meanwhile, in the chamber, various internal members for processing the substrate may be installed in the processing space. As one example, a substrate support part, which is installed to move to the inside and outside of the chamber and supports at least one dummy substrate, may be included.

Here, the substrate support part supports a plurality of substrates vertically stacked in a batch-type structure, and may be configured to pass through the lower portion of the opened chamber and move up and down.

Through this, the substrate support part is raised to the processing space inside the chamber, and the substrate processing is performed on the plurality of substrates while the substrate support part supports the same. The substrate support part is lowered while passing through the lower portion of the chamber, and then moves to a loading space to perform loading and unloading on the plurality of substrates.

During this, the substrate support part is exposed to various external gases, for example, oxygen ($O_2$) in the loading space. These external gases are input together into the processing space, and may interrupt the process or change into impurities and pollutants.

Consequently, a purge process on the external gases represented by the oxygen and a seasoning or cleaning process on the chamber and the internal member of the chamber may need to be performed.

Furthermore, in addition to the external gases described above, pollutants, which are generated internally during the substrate processing process and accumulated inside the chamber, have an effect as particles on the substrate processing that is subsequently performed. Thus, the cleaning process for the inside of the chamber and the internal member of the chamber may be required to solve this effect.

Meanwhile, here, the substrate support part may be processed in a state in which the substrate to be processed is removed, and here, dummy substrates generally disposed at the uppermost end and the lowermost end may be processed together.

Furthermore, the substrate support part may be provided with a quartz material like the chamber described above.

The internal chamber processing operation (S10) may be an operation for processing the inside of the chamber in which the substrate processing is performed, and this will be described later in detail in the internal chamber processing.

The substrate inputting operation (S300) is an operation of inputting the substrate to be processed to the chamber after the internal chamber processing operation (S10), and may be performed by various methods.

For example, the internal chamber processing operation (S10) may input the substrate to be processed into the chamber in a state in which processing on the inside of the chamber and the internal member is completed through the internal chamber processing operation (S10).

Here, in the substrate inputting operation (S300), the processed substrate support part is lowered to a loading region, and after a plurality of substrates are loaded thereon, the substrate support part is raised to the processing space, and the substrate may be input into the chamber.

The substrate processing operation (S20) is an operation of performing substrate processing on the substrate, which is input into the chamber, and may be performed by various methods.

Here, in the substrate processing operation (S20), various processes such as a deposition process, an etching process, and a heat treatment process may be performed, and any process of processing a substrate disclosed in the related art may be applied.

Particularly, in the substrate processing operation (S20), an annealing process such as heat treatment on the plurality of substrates may be performed.

More specifically, the substrate processing operation (S20) may include a substrate processing-pressurizing operation of raising a pressure inside the chamber to a third pressure higher than the atmospheric pressure and a substrate processing-depressurizing operation of lowering the pressure inside the chamber from the third pressure to a fourth pressure after the substrate processing-pressurizing operation.

Here, the fourth pressure is a pressure lower than the atmospheric pressure, and the substrate processing-pressurizing operation and the substrate processing-depressurizing operation may be repeatedly performed several times.

Meanwhile, the substrate processing-pressurizing operation and the substrate processing-depressurizing operation performed in the substrate processing operation (S20) may be conducted in the identical or similar pattern to a pressurizing operation (S100) and a depressurizing operation (S200) which will be described later, but pressure conditions and temperature conditions thereof may be differently applied.

Meanwhile, the detailed description of the substrate processing operation (S20) may use the contents of Korean Application Publication Nos. KR10-2020-0006422A, KR10-2020-0029895A, and KR10-2020-0031798A, and may include the contents disclosed in Korean Application Publication.

The substrate ejecting operation (S400) is an operation of ejecting the substrate processed through the substrate processing operation (S20), and may be performed by various methods.

For example, in the substrate ejecting operation (S400), the substrate support part for supporting the processed substrates is lowered from the processing space to the loading region, and the processed substrates are unloaded in the loading region.

Meanwhile, the substrate inputting operation (S300), the substrate processing operation (S20), and the substrate ejecting operation (S400) are referred to as one unit process (S30), and may be repeatedly performed for substrate processing on the plurality of substrates to be processed.

During this process, the internal chamber processing operation (S10) may be performed during a first set up for the chamber before the unit process (S30) is performed.

That is, as illustrated in FIG. 4, the internal chamber processing operation (S10) may be performed for processing the inside of the chamber and the internal member during the first set up for the chamber, in which substrate processing is performed, before the unit process (S30) is performed. In a state in which the processing on the inside of the chamber is completed, the unit process (S30) including the substrate inputting operation (S300), the substrate processing operation (S20), and the substrate ejecting operation (S400) may be repeatedly performed.

Meanwhile, in another example as illustrated in FIG. 5, the internal chamber processing operation (S10) may be performed between the unit process (S30) and the unit process (S30), and for this, a processing determination operation (S500) of determining whether or not processing on the inside of the chamber is necessary may be further included prior to the chamber processing operation (S10).

Here, the processing determination operation (S500) determines whether or not processing on the inside of the chamber and the internal member is necessary in a state in which the unit process (S30) is completed, and may induce to continuously and repeatedly perform the unit process (S30) or perform the internal chamber processing operation (S10).

Here, in the processing determination operation (S500), whether or not processing on the inside of the chamber is necessary may be determined through a preset reference value after the substrate ejecting operation (S400). As one example, sheet resistance on the processed substrate is measured, and when the measurement value is greater than or equal to the preset value, the internal chamber processing operation (S10) may be performed.

Meanwhile, in the processing determination operation (S500) as another example, according to the preset number of repetition of the unit process (S30), that is, the preset n value, it may be determined to perform the internal chamber processing operation (S10) when reaching the preset number of repetition.

Meanwhile, it is also apparent that the internal chamber processing operation (S10) may be performed while overall maintenance and repair are performed on the chamber and the internal member.

Hereinafter, the internal chamber processing method corresponding to the internal chamber processing operation (S10) will be described with reference to the drawing.

Figure 1:
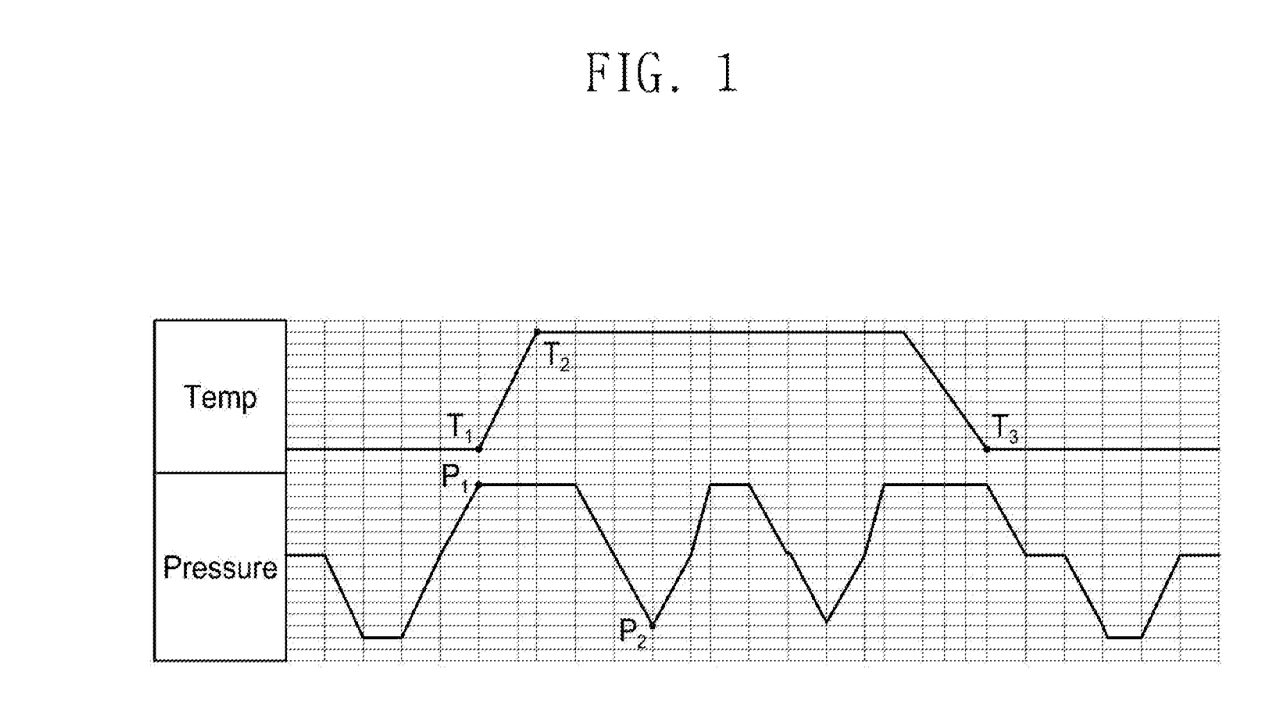
FIG. 1 is a graph showing changes in pressure and temperature when an internal chamber processing method according to the present invention is performed.
Figure 2:
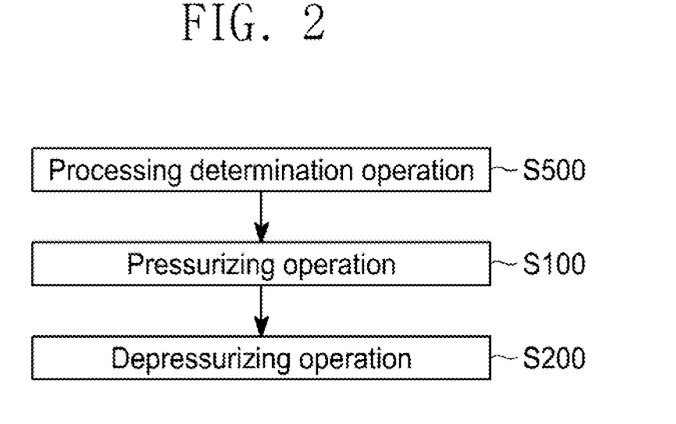
FIG. 2 is a flowchart showing an embodiment of the internal chamber processing method of FIG. 1.
Figure 3:
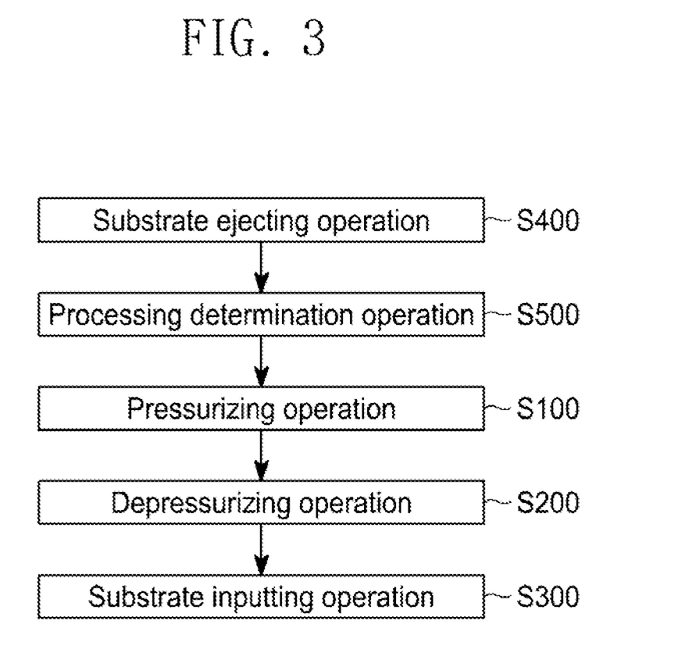
FIG. 3 is a flowchart showing another embodiment of the internal chamber processing method of FIG. 1.

As illustrated in FIG. 1, the internal chamber processing method includes: a pressurizing operation (S100) of raising a pressure inside the chamber to a first pressure $P_1$ higher than the atmospheric pressure by using a pressurized gas; and a depressurizing operation (S200) of lowering the pressure inside the chamber from the first pressure $P_1$ after the pressurizing operation (S100). The pressurizing operation (S100) and the depressurizing operation (S200) are performed in a state in which a substrate to be processed is removed from the inside of the chamber.

Also, the internal chamber processing method according to the present invention may further include a temperature raising operation of raising a temperature inside the chamber from a first temperature $T_1$ to a processing temperature $T_2$ higher than the room temperature, a high-temperature maintaining operation of maintaining the processing temperature $T_2$, and a temperature lowering operation of lowering the temperature inside the chamber from the processing temperature $T_2$ to a second temperature $T_3$.

Also, the internal chamber processing method may further include a substrate inputting operation (S300) of inputting the substrate to be processed into the chamber.

Also, prior to the pressurizing operation (S100), the internal chamber processing method may further include a substrate ejecting operation (S400) of ejecting the substrate to be processed to the outside of the chamber and a processing determination operation (S500) of determining whether or not processing on the inside of the chamber is necessary.

Here, the substrate inputting operation (S300), the substrate ejecting operation (S400), and the processing determination operation (S500) are identical to those described above, and thus, their duplicated descriptions will be omitted.

In the present invention, the first temperature $T_1$ may be about 200° C., the processing temperature $T_2$ may be about 600° C., and the second temperature $T_3$ may be 200° C. equal to the first temperature $T_1$.

Meanwhile, it is apparent that the second temperature $T_3$ may have a temperature different from the first temperature $T_1$.

The first pressure $P_1$ may be about 2 atm, and the second pressure $P_2$ may have a vacuum state pressure value of about 10 torr.

In the pressurizing operation (S100), the pressure inside the chamber may be raised to the first pressure $P_1$ higher than the atmospheric pressure by using the pressurized gas.

Here, in the pressurizing operation (S100), the pressure inside the chamber may be raised from the atmospheric pressure to the first pressure $P_1$ or raised from the vacuum to the first pressure $P_1$.

More specifically, the pressurizing operation (S100) may be repeatedly performed n times while forming a unit cycle with the depressurizing operation (S200), and thus, may raise the pressure inside the chamber from the second pressure $P_2$ to the first pressure P1 in a state in which the pressure is lowered to the second pressure $P_2$ by the depressurizing operation (S200).

Here, the first pressure $P_1$ may be set to various pressure values higher than the atmospheric pressure and may be, for example, about 2 atm higher than the atmospheric pressure.

Meanwhile, the pressurized gas may be a gas that includes at least one element of hydrogen (H), oxygen (O), nitrogen (N), chlorine (Cl), or fluorine (F), more preferably, may be a hydrogen (H) gas.

Here, the pressurized gas may coat, through the hydrogen gas, the inner wall of the chamber and the surfaces of internal members such as the substrate support part and the dummy substrate, and accordingly, as described above, the oxygen entering while the substrate support part is raised may be prevented from being adsorbed to the inside of the chamber.

More specifically, when the surface on the inside of the chamber and the surface of the internal member of the chamber have a quartz material, the hydrogen may be coupled to the quartz surface to form Si—H, Si—OH bond, thereby forming a film. Accordingly, due to the formed film, the oxygen may be prevented from being adsorbed to the inside of the chamber by preventing coupling with the oxygen.

Also, in the pressurizing operation (S100), the inside of the chamber is raised to the high pressure through the pressurized gas, and by-products may be formed by reaction with impurities on the surface and the inside of the inner wall of the chamber and the internal member. Accordingly, pollutants chemically bonded to the surface and the inside of the inner wall of the chamber and the internal member may be separated therefrom.

Subsequently, as the depressurizing operation (S200), which will be described later, is performed, the by-products formed by bonding to the pressurized gas may be suctioned to the surface of the inner wall of the chamber and the internal member and the processing space, and these by-products may be discharged to the outside in a composition of vacuum state.

Meanwhile, the pressurizing operation (S100) may include a pressure raising operation of raising the pressure inside the chamber to the first pressure $P_1$ and a high-pressure maintaining operation of maintaining the pressure inside the chamber at the first pressure $P_1$ for a certain period of time after the pressure raising operation.

The high-pressure maintaining operation may be an operation in which the pressure inside the chamber is maintained, for a certain period of time, at the first pressure $P_1$ formed through the pressure raising operation.

Here, in the high-pressure maintaining operation, the pressure inside the chamber may be maintained at the first pressure $P_1$ by continuously supplying the pressurized gas. Through this, the pressurized gas may penetrate the surface and the inside of the inner wall of the chamber and the internal member installed inside the chamber as described above, and the by-products may be formed by bonding to the pollutants, or the surface may be coated.

Furthermore, in the high-pressure maintaining operation, the pressure inside the chamber is maintained at the high pressure, that is, the first pressure $P_1$ by continuously supplying the pressurized gas. Thus, a function of discharging the pollutants may be performed by physical pressure of the gas.

Also, as another function, in the pressurizing operation, a metal film is deposited, or heat treatment on the metal film may be performed. Accordingly, bonding relationships of metal materials accumulated on at least one of the inner wall of the chamber and the internal member of the chamber may be broken to discharge the same.

More specifically, when metal materials such as Ti, Li, and Cu are coupled to each other and accumulated on at least one of the inner wall of the chamber and the internal member of the chamber through processing on the metal film, or when these metal materials are bonded to the surface of at least one of the inner wall of the chamber and the internal member of the chamber, these bonds may be broken by forming a pressurizing atmosphere through the pressurized gas, thereby discharging the impurities.

Meanwhile, at least one of a temperature raising operation and a temperature lowering operation, which will be described later, is also performed during the high-pressure maintaining operation, thus inducing the inner wall of the chamber and the internal member of the chamber to be smoothly coated with the hydrogen. This will be described later.

The depressurizing operation (S200) may be an operation of lowering the pressure inside the chamber from the first pressure $P_1$ after the pressurizing operation (S100).

Here, in the depressurizing operation (S200), the pressure inside the chamber may be lowered through both an exhaust port formed in a manifold in a lower portion of the chamber and an exhaust value connected thereto. During this process, connection to an external exhaust pump may be established.

The second pressure $P_2$ may have a pressure value lower than the first pressure $P_1$ and may be greater or less than the atmospheric pressure, and more preferably, may have a pressure value in a vacuum state lower than the atmospheric pressure so as to discharge the impurities to the outside.

Meanwhile, the pressurizing operation (S100) and the depressurizing operation (S200) are referred to as one unit cycle and performed n times, and at least one unit cycle may be performed during the high-temperature maintaining operation.

Here, the pressurizing operation (S100) and the depressurizing operation (S200) are performed repeatedly in a high-temperature state, and thus, impurities may be removed, or reaction of applying components of the pressurized gas such as hydrogen may be promoted.

More specifically, thermal vibration of atoms is increased by repeatedly performing the pressurizing operation (S100) and the depressurizing operation (S200) in a high-temperature state, and this can promote breaking of bonds of the impurities that are weakly bonded to the inside of the chamber. Furthermore, bonding of the component of the pressurized gas such as hydrogen to the inside of the chamber, that is, the inner wall of the chamber and the surface of the internal member of the chamber may be improved.

The temperature raising operation may be an operation of raising the temperature inside the chamber from first temperature $T_1$ to the processing temperature $T_2$ higher than the room temperature.

Here, in the temperature raising operation, the temperature inside the chamber may be raised from the first temperature $T_1$ to the processing temperature $T_2$ higher than the room temperature so as to create a temperature atmosphere for processing the inside of the chamber. Accordingly, a temperature condition for processing the inside of the chamber may be created.

Here, the temperature raising operation may be performed during the pressurizing operation (S100) and, more specifically, may be performed in the pressure raising operation or the high-pressure maintaining operation.

The temperature lowering operation may be an operation of lowering the temperature inside the chamber from the processing temperature $T_2$, which is the temperature for processing the inside of the chamber, to the second temperature $T_3$.

Here, the second temperature $T_3$ may be a temperature corresponding to a process condition for a process to be performed after processing on the inside of the chamber is completed, or may be equal to the first temperature $T_1$ described above or may be a different temperature according to a subsequent process.

Here, the temperature lowering operation may be performed during the high-pressure maintaining operation and, more specifically, may lower the temperature from the processing temperature $T_2$ to the second temperature $T_3$ while the pressure inside the chamber is maintained at the first pressure $P_1$ which is in a high pressure state higher than the atmospheric pressure.

More specifically, when the pressure is lower than the atmospheric pressure in a state in which $O_2$ remains inside a chamber according to the related art, in a case in which the temperature inside the chamber is raised or the temperature inside the chamber is lowered, $O_2$ remaining inside the chamber reacts with the inside of the chamber and a thin film while being outgassed.

In order to improve this limitation, the temperature raising operation and the temperature lowering operation may be performed during the pressurizing operation (S100), particularly, the high-pressure maintaining operation (S120). More specifically, a temperature raising start point and a temperature raising end point of the temperature raising operation and a temperature lowering start point and a temperature lowering end point of the temperature lowering operation may be specified as points in which degradation of the inside of the chamber and the thin film can be minimized.

For example, the temperature raising operation may raise the temperature atmosphere from the first temperature $T_1$ to the processing temperature $T_2$, from the preset temperature raising start point to the temperature raising end point during performing the pressurizing operation (S100) or after performing the pressurizing operation (S100).

Here, the temperature raising start point and the temperature raising end point in the temperature raising operation may be set between a start point of the pressurizing operation (S100) (a start point from which pressurizing to the first pressure P starts) and a start point of the depressurizing operation (S200) (a start point from which depressurizing to the second pressure $P_2$ starts).

As one example, the temperature raising operation may raise the temperature from the preset temperature raising start point to the temperature raising end point during performing the pressurizing operation (S100).

Here, the temperature raising start point may be set to any start point after the start point of the pressurizing operation (S100), but preferably, may be set to a start point after a process pressure is pressurized to the atmospheric pressure or higher by inputting a certain amount of the pressurized gas so that the inside of the chamber can be sufficiently protected from the $O_2$ gas.

Like the temperature raising operation described above, the temperature lowering operation may lower the temperature atmosphere from the processing temperature $T_2$ to the second temperature $T_3$, from the preset temperature lowering start point to the temperature lowering end point during performing the pressurizing operation (S100) or after performing the pressurizing operation (S100).

Here, the temperature lowering start point and the temperature lowering end point in the temperature lowering operation may be set between the start point of the pressurizing operation (S100) (the start point from which pressurizing to the first pressure $P_1$ starts) and the start point of the depressurizing operation (S200) (the start point from which depressurizing to the second pressure $P_2$ starts).

As one example, the temperature lowering operation may lower the temperature from the preset temperature lowering start point to the temperature lowering end point during performing the pressurizing operation (S100).

Here, the temperature lowering start point may be set to any start point after the start point of the pressurizing operation (S100), but preferably, may be set to a start point after a process pressure is pressurized to the atmospheric pressure or higher by inputting a certain amount of the pressurized gas so that the inside of the chamber can be sufficiently protected from the $O_2$ gas. In the same situation, the temperature lowering start point may be set to a start point before the end point of the depressurizing operation (S200), that is, before the process pressure inside the chamber is lowered to the atmospheric pressure or less.

Meanwhile, as one example, when the pressurizing operation (S100) and the depressurizing operation (S200) are referred to as one unit cycle and repeatedly performed n times, the temperature lowering operation may be performed during the high-pressure maintaining operation of the last n-th pressurizing operation.

That is, while the unit cycle is repeatedly performed once to n−1 times, the temperature inside the chamber may be maintained at the processing temperature $T_2$ so as to create the processing temperature for processing the inside of the chamber, and the temperature lowering operation may be performed during the high-pressure maintaining operation at the n-th cycle for the temperature condition of the subsequent process.

Meanwhile, hereinafter, the effects of the internal chamber processing method according to the present invention will be described in detail with reference to FIG. 6.

Figure 6:
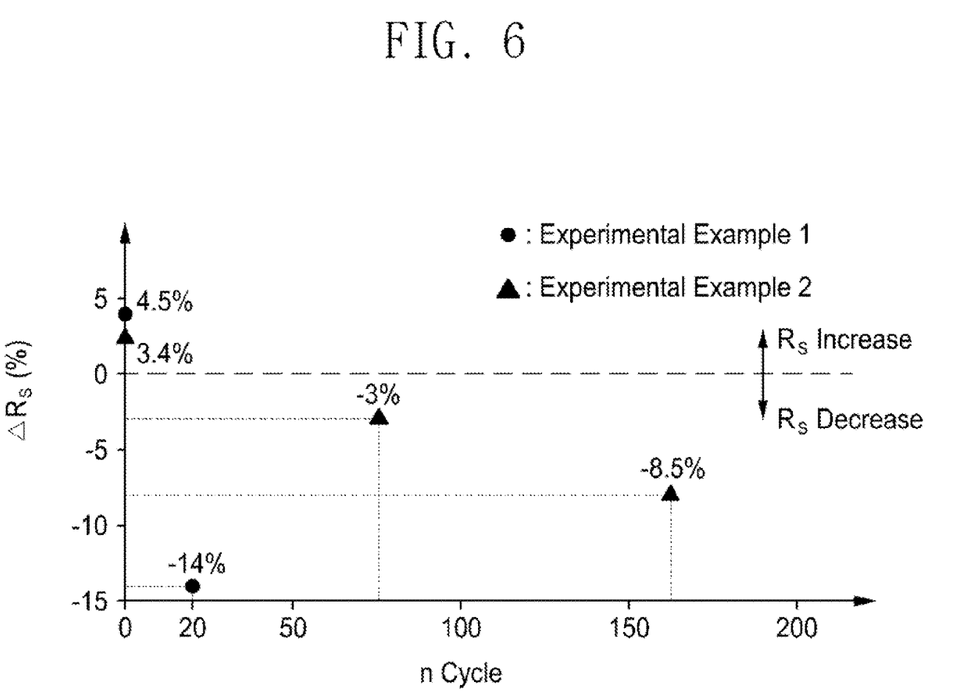
FIG. 6 is a graph showing effects of the internal chamber processing method of FIG. 1.

As illustrated in FIG. 6, the internal chamber processing method according to the present invention has the effects of reducing sheet resistance Rs of the substrate to be processed by processing the inside of the chamber in which the substrate processing described above is performed, thus enabling the high-quality substrate processing.

In a graph according to FIG. 6, the results of Experimental Example 1 are shown. Here, the temperature raising operation is performed in the pressurizing operation (S100) of the first unit cycle among the repetitive unit cycles, and the temperature lowering operation is performed in the pressurizing operation (S100) of the last unit cycle among the unit cycles. The pressurizing operations (S100) and the depressurizing operations (S200) of the remaining unit cycles are repeatedly performed in the high-temperature maintaining operation.

Also, the results of Experimental Example 2 are shown. Here, the unit cycles of all of the pressurizing operations (S100) and the depressurizing operations (S200) are repeatedly preformed in the high-temperature maintaining operation.

First, when the processing on the inside of the chamber according to the present invention is not performed, it may be confirmed that the sheet resistance increases by about 4.5% in Experimental Example 1, and the sheet resistance increases by about 3.4% in Experimental Example 2 as illustrated in FIG. 6.

However, when the processing on the inside of the chamber according to the present invention is performed, that is, in a case in which the unit cycles are repeatedly performed about 20 times in Experimental Example 1, it may be confirmed that the sheet resistance decreases by about 14%. Also, in a case in which the unit cycles are repeatedly performed about 70 times in Experimental Example 2, the sheet resistance decreases by about 3%, and in a case in which the unit cycles are repeatedly performed about 160 times, the sheet resistance decreases by about 8.5%.

That is, although there are differences in degrees depending on the numbers of repetition thereof, it may be confirmed that all of Experimental Example 1 and Experimental Example 2, in which the processing on the inside of the chamber is performed according to the present invention, show reduced sheet resistance of the processed substrate, compared to the case in which the processing on the inside of the chamber is not performed.

Also, it may be further confirmed that Experimental Example 1 shows significantly greater reduction in sheet resistance than in Experimental Example 2.

The internal chamber processing method and the substrate processing method according to the present invention may effectively remove the pollutants, particles, and the like on the inner wall of the chamber and the internal member of the chamber.

Particularly, the internal chamber processing method and the substrate processing method according to the present invention frequently and regularly clean the pollutants and particles on the inner wall of the chamber and the internal member of the chamber. Thus, the overall maintenance and repair cycle may be extended to increase process efficiency.

Moreover, the internal chamber processing method and the substrate processing method according to the present invention separate pollution sources that penetrate the surfaces of the inner wall of the chamber and the internal member of the chamber to a certain depth, and discharge the pollution sources to the outside. Thus, it is possible to perform high-quality cleaning.

Also, the internal chamber processing method and the substrate processing method according to the present invention may effectively prevent thin films from being deposited on the inner wall of the chamber and the internal member of the chamber during the substrate processing process by performing the seasoning on the inner wall of the chamber and the internal member of the chamber.

Particularly, the internal chamber processing method and the substrate processing method according to the present invention performs processing, by using hydrogen, on the internal member of the chamber generally made of the quartz material. Thus, oxygen is effectively prevented from being adsorbing, and these methods may be effectively utilized in a process sensitive to oxygen.

Consequently, the internal chamber processing method and the substrate processing method according to the present invention may more effectively improve characteristics (e.g., sheet resistance) of thin films which are formed on the substrate processed in the same chamber through the processing on the inside of the chamber.

The above is merely described with respect to some preferred embodiments that may be implemented according to the present invention. Thus, as is well known, the scope of the present invention should not be construed as being limited by the above embodiments, and the technical ideas of the present invention described above and technical concepts on the basis of these technical ideas are considered to be included in the scope of the present invention.

What is claimed is:

1. A substrate processing method comprising:
an internal chamber processing operation through the internal chamber processing method for processing the inside of a chamber in which substrate processing is performed, the internal chamber processing method comprising:
a pressurizing operation of raising a pressure inside a chamber to a first pressure $P_1$ higher than the atmospheric pressure by using a pressurized gas; and
a depressurizing operation of lowering the pressure inside the chamber from the first pressure $P_1$ to a second pressure $P_2$ after the pressurizing operation,
wherein the pressurizing operation and the depressurizing operation are performed in a state in which a substrate to be processed is removed from the inside of the chamber to react with impurities and remove them from inside the chamber,
wherein, in the pressurizing operation, the pressurized gas produces a by-product by reacting with impurities on a surface or inside at least one inner wall of the chamber and an internal member installed inside the chamber,
wherein, in the depressurizing operation, the by-product is discharged outside of the chamber;
a substrate inputting operation of inputting a substrate to be processed to the chamber after the internal chamber processing operation;
a substrate processing operation of performing substrate processing on the substrate input into the chamber; and
a substrate ejecting operation of ejecting the substrate processed through the substrate processing operation,
wherein the substrate inputting operation, the substrate processing operation, and the substrate ejecting operation are referred to as one unit process, and unit processes are repeatedly performed n times (n≥2).

2. The substrate processing method of claim 1, wherein the internal chamber processing operation is performed between the unit process and the unit processes or prior to a first unit process.

3. The substrate processing method of claim 1, wherein the internal chamber processing operation is performed between the unit processes and the unit process, and
the substrate processing method further comprises a processing determination operation of determining whether or not processing on the inside of the chamber is necessary after the unit process is performed.

4. The substrate processing method of claim 3, wherein sheet resistance on the processed substrate is measured in the processing determination operation, and the internal chamber processing operation is performed when the measurement value is greater than or equal to a preset value, or the unit process is performed when the measurement value is less than the preset value.

5. The substrate processing method of claim 1, wherein the substrate processing operation comprises a substrate processing-pressurizing operation of raising a pressure inside the chamber to a pressure higher than the atmospheric pressure and a substrate processing-depressurizing operation of lowering the pressure inside the chamber after the substrate processing-pressurizing operation.

6. The substrate processing method of claim 5, wherein the substrate processing-depressurizing operation lowers the pressure inside the chamber to a pressure lower than the atmospheric pressure, and
the substrate processing-pressurizing operation and the substrate processing-depressurizing operation are repeatedly performed several times.

7. An internal chamber processing method for processing the inside of a chamber in which substrate processing is performed, the internal chamber processing method comprising:
a pressurizing operation of raising a pressure inside a chamber to a first pressure $P_1$ higher than the atmospheric pressure by using a pressurized gas; and
a depressurizing operation of lowering the pressure inside the chamber from the first pressure $P_1$ to a second pressure $P_2$ after the pressurizing operation,
wherein the pressurizing operation and the depressurizing operation are performed in a state in which a substrate to be processed is removed from the inside of the chamber to react with impurities and remove them from inside the chamber,
wherein, in the pressurizing operation, the pressurized gas produces a by-product by reacting with impurities on a surface or inside at least one inner wall of the chamber and an internal member installed inside the chamber, by raising a pressure inside a chamber to the first pressure by using a pressurized gas,
wherein, in the depressurizing operation, the by-product is discharged outside of the chamber by lowering the pressure inside the chamber from the first pressure to the second pressure, and
wherein a cleaning process on the inside of the chamber and the internal member by removing impurities from the chamber and the internal member through pressure variations caused by the supply and exhaust of the pressurized gas, thereby preventing residual by-products from remaining, is performed by the pressurizing operation and the depressurizing operation.

8. The internal chamber processing method of claim 7, wherein the second pressure $P_2$ is lower than the atmospheric pressure.

9. The internal chamber processing method of claim 7, wherein when the pressurizing operation and the depressurizing operation are referred to as one unit cycle, unit cycles are performed n times (n≥1).

10. The internal chamber processing method of claim 7, wherein the pressurizing operation comprises a pressure raising operation of raising the pressure inside the chamber to the first pressure $P_1$ and a high-pressure maintaining operation of maintaining the pressure inside the chamber at the first pressure $P_1$ for a certain period of time after the pressure raising operation.

11. The internal chamber processing method of claim 7, further comprising, prior to the pressurizing operation, a processing determination operation of determining whether or not processing on the inside of the chamber is necessary.

12. The internal chamber processing method of claim 11, wherein in the processing determination operation, sheet resistance on the substrate processed inside the chamber is measured, and it is determined that the pressurizing operation is performed when the measurement value is greater than or equal to a preset value.

13. The internal chamber processing method of claim 7, comprising a temperature raising operation of raising a temperature inside the chamber from a first temperature $T_1$ to a processing temperature $T_2$ higher than the room temperature, a high-temperature maintaining operation of maintaining the processing temperature $T_2$, and a temperature lowering operation of lowering the temperature inside the chamber from the processing temperature $T_2$ to a second temperature $T_3$, wherein the pressurizing operation and the depressurizing operation are referred to as one unit cycle, unit cycles are performed n times (n≥1), and at least one of the unit cycles is performed during the high-temperature maintaining operation.

14. The internal chamber processing method of claim 10, comprising a temperature raising operation of raising a temperature inside the chamber from a first temperature $T_1$ to a processing temperature $T_2$ higher than the room temperature and a temperature lowering operation of lowering the temperature inside the chamber from the processing temperature $T_2$ to a second temperature $T_3$, wherein the temperature raising operation or the temperature lowering operation is performed during the high-pressure maintaining operation.

15. The internal chamber processing method of claim 14, wherein when the pressurizing operation and the depressurizing operation are referred to as one unit cycle, unit cycles are repeatedly performed n times (n≥2), and the temperature lowering operation is performed during the high-pressure maintaining operation of the n-th pressurizing operation.

16. The internal chamber processing method of claim 7, wherein the pressurized gas is a hydrogen gas $H_2$.

17. The internal chamber processing method of claim 16, wherein in the pressurizing operation, surfaces of an inner wall of the chamber and an internal member installed inside the chamber are coated by coupling some or all of components of the pressurized gas to the surfaces of the inner wall of the chamber and the internal member installed inside the chamber.

18. The internal chamber processing method of claim 17, wherein at least one of the chamber and the internal member installed inside the chamber comprises a quartz material.

19. The internal chamber processing method of claim 17, wherein the internal member installed inside the chamber is installed to move to the inside and outside of the chamber and comprises a substrate support part for supporting at least one dummy substrate.

\* \* \* \* \*